United States Patent
Gao

(10) Patent No.: US 9,864,247 B1
(45) Date of Patent: Jan. 9, 2018

(54) TFT DEVICE WITH SILICON NITRIDE FILM AND MANUFACTURING METHOD THEREOF

(71) Applicant: Shenzhen China Star Optoelectronics Technology Co., Ltd., Shenzhen (CN)

(72) Inventor: Dongzi Gao, Shenzhen (CN)

(73) Assignee: Shenzhen China Star Optoelectronics Technology Co., Ltd., Shenzhen (CN)

(*) Notice: Subject to any disclaimer, the term of this patent is extended or adjusted under 35 U.S.C. 154(b) by 0 days.

(21) Appl. No.: 15/310,098

(22) PCT Filed: Aug. 3, 2016

(86) PCT No.: PCT/CN2016/093066
§ 371 (c)(1),
(2) Date: Nov. 10, 2016

(30) Foreign Application Priority Data

Jul. 8, 2016 (CN) .......................... 2016 1 0539705

(51) Int. Cl.
*G02F 1/1362* (2006.01)
*G02F 1/1368* (2006.01)

(52) U.S. Cl.
CPC ...... *G02F 1/136286* (2013.01); *G02F 1/1368* (2013.01); *G02F 1/136204* (2013.01); *G02F 2001/13629* (2013.01); *G02F 2001/136295* (2013.01)

(58) Field of Classification Search
CPC combination set(s) only.
See application file for complete search history.

(56) References Cited

U.S. PATENT DOCUMENTS

| 6,184,948 | B1 | 2/2001 | Lee |
| 6,259,119 | B1* | 7/2001 | Ahn ................. G02F 1/13458 257/347 |
| 2010/0279473 | A1 | 11/2010 | Jung |
| 2014/0231804 | A1* | 8/2014 | Yan ................. H01L 27/1214 257/53 |
| 2015/0311232 | A1* | 10/2015 | Sun ................. G02F 1/136227 257/72 |
| 2016/0181437 | A1* | 6/2016 | Bu ................. H01L 21/0274 257/66 |
| 2016/0209942 | A1* | 7/2016 | Yang ................. G06F 3/0412 |
| 2016/0218124 | A1* | 7/2016 | Wang ................. H01L 27/124 |
| 2017/0092658 | A1* | 3/2017 | Sun ................. H01L 27/124 |

FOREIGN PATENT DOCUMENTS

CN 1992291 7/2007

* cited by examiner

*Primary Examiner* — Mamadou Diallo

(57) ABSTRACT

A TFT device of a liquid crystal display and a manufacturing method therefor are provided. The TFT device has: a substrate; a first metal layer formed on the substrate on which a first silicon nitride protective film is deposited; a second metal layer deposited on the first silicon nitride protective film on which a second silicon nitride protective film is deposited; and a conductive film deposited on the second metal layer where the second silicon nitride protective film is etched, and connected with the first metal layer through a contact hole which passes through the first and second silicon nitride protective films, so that the first and second metal layers are connected. Thus, the connecting distance of the conductive film between the different metal layers and the contact resistance between metals are decreased, so as to enhance the product yield rate and the competitive capability of the product.

11 Claims, 2 Drawing Sheets

TFT DEVICE WITH SILICON NITRIDE FILM AND MANUFACTURING METHOD THEREOF

RELATED APPLICATIONS

This application is a National Phase of PCT Patent Application No. PCT/CN2016/093066 having International filing date of Aug. 3, 2016, which claims the benefit of priority of Chinese Patent Application No. 201610539705.X filed on Jul. 8, 2016. The contents of the above applications are all incorporated by reference as if fully set forth herein in their entirety.

FIELD AND BACKGROUND OF THE INVENTION

The present invention relates to a technical field of liquid crystal displays, and more particularly to a TFT device of a liquid crystal display and a manufacturing method therefor.

In a TFT (thin film transistor) liquid crystal display, different metal layers are connected through an ITO (indium tin oxide) transparent conductive film. Because the resistance and impedance of the ITO is much greater than that of metallic aluminum or copper, it causes the contact impedance between different metal layers to be great, and then the display effect is not good in the following process.

Refer now to FIG. 1, which is a cross-sectional structural schematic view of a traditional TFT device of a liquid crystal display (LCD). A scan electrode line 12 is formed on a glass substrate 11; the scan electrode line 12 is covered with a first silicon nitride protective film 13; and a signal electrode line 14 is covered with a second silicon nitride protective film 15. Above the scan electrode line 12, the first silicon nitride protective film 13 and the second silicon nitride protective film 15 are respectively etched to form a first contact hole 16; and above the signal electrode line 14, the second silicon nitride protective film 15 is etched to form a second contact hole 17. After that, an ITO layer 18 is deposited to connect with the different metal layers. In this connecting method, the ITO layer 18 must begin from the first contact hole 16 on the scan electrode line 12, climb the first silicon nitride protective film 13 and the second silicon nitride protective film 15, pass through the second contact hole 17 on the signal electrode line 14, and then connect together the two metal lines. Because the impedance value of the ITO is much greater than that of metallic aluminum or copper, this connecting method will cause the contact impedance to be great, and thereby it can easily occur that the display effect is not good in the following process.

Hence, it is necessary to provide a new TFT device of a liquid crystal display with a different connecting method for metal layers, so as to lower the contact impedance between the metal layers, and increase the product yield rate.

SUMMARY OF THE INVENTION

A purpose of the present invention is to provide a TFT device of a liquid crystal display and a manufacturing method therefor. Compared with a connecting method for different metal layers of a traditional TFT device of a liquid crystal display, the present invention can lower the contact impedance and increase the display effect.

To accomplish the above-mentioned purpose, the present invention provides a TFT device of a liquid crystal display, which comprises: a substrate; a first metal layer formed on the substrate, wherein a first silicon nitride protective film is deposited on the first metal layer; a second metal layer deposited on the first silicon nitride protective film, wherein a second silicon nitride protective film is deposited on the second metal layer; and a conductive film deposited on the second metal layer where the second silicon nitride protective film is etched, and connected with the first metal layer through a contact hole which passes through the second silicon nitride protective film and the first silicon nitride protective film, so that the first metal layer is connected and conducted with the second metal layer; wherein the second silicon nitride protective film and the first silicon nitride protective film are etched by one patterning process to form the contact hole which exposes the first metal layer, while the second silicon nitride protective film is etched to expose the second metal layer; and the contact hole passes through the second silicon nitride protective film and the first silicon nitride protective film to contact with the first metal layer and the second metal layer, respectively.

To accomplish the above-mentioned purpose, the present invention further provides a TFT device of a liquid crystal display, which comprises: a substrate; a first metal layer formed on the substrate, wherein a first silicon nitride protective film is deposited on the first metal layer; a second metal layer deposited on the first silicon nitride protective film, wherein a second silicon nitride protective film is deposited on the second metal layer; and a conductive film deposited on the second metal layer where the second silicon nitride protective film is etched, and connected with the first metal layer through a contact hole which passes through the second silicon nitride protective film and the first silicon nitride protective film, so that the first metal layer is connected and conducted with the second metal layer.

To accomplish the above-mentioned purpose, the present invention further provides a manufacturing method of the TFT device of a liquid crystal display, which comprises: 1) depositing a first silicon nitride protective film on a first metal layer formed on a substrate; 2) depositing a second metal layer and a second silicon nitride protective film on the first silicon nitride protective film in order; and 3) depositing a conductive film on the second metal layer where the second silicon nitride protective film is etched, and on a contact hole which passes through the second silicon nitride protective film and the first silicon nitride protective film, so as to connect and conduct with the first metal layer and the second metal layer.

The present invention has advantages: by the TFT device of a liquid crystal display and the manufacturing method therefor according to the present invention, for the conductive film, the connecting distance of the conductive film between the different metal layers is decreased, the impedance value between metals is decreased therewith, so as to effectively lower the contact impedance between the different metal layers, increase the product yield rate, and increase the competitive capability of the product.

DESCRIPTION OF SPECIFIC EMBODIMENTS OF THE INVENTION

In the accompanying drawings a TFT device of a liquid crystal display and a manufacturing method therefor of the invention are shown by way of illustration.

Figure 1:
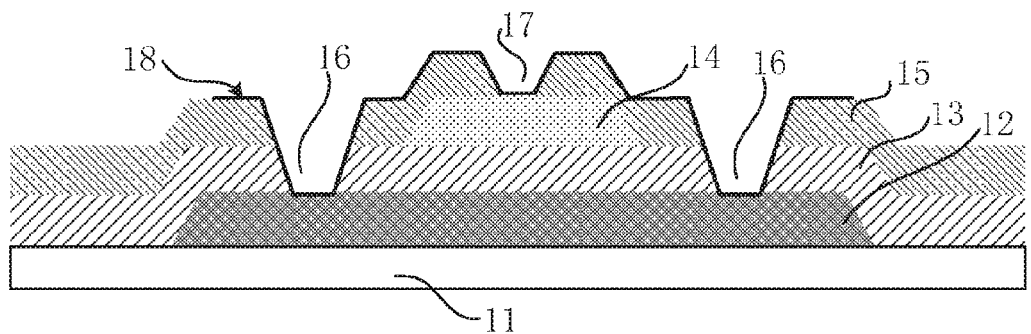
FIG. 1 is a cross-sectional structural schematic view of a traditional TFT device of a liquid crystal display.
Figure 2:
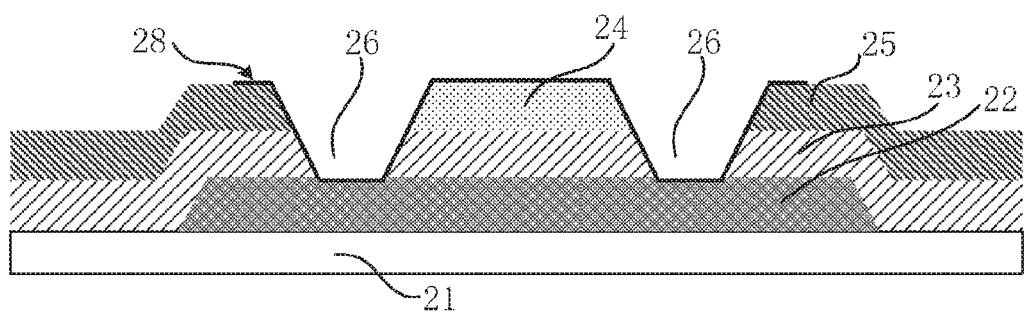
FIG. 2 is a cross-sectional structural schematic view of a TFT device of a liquid crystal display according to an embodiment of the present invention.

Refer now to FIG. 2, which is a cross-sectional structural schematic view of a TFT device of a liquid crystal display (LCD) according to an embodiment of the present invention. The TFT device of a liquid crystal display comprises: a substrate 21, a first metal layer 22, a first silicon nitride protective film 23, a second metal layer 24, a second silicon nitride protective film 25, a contact hole 26, and a conductive film 28.

The substrate 21 can be a glass substrate or a plastic substrate. The first metal layer 22 is formed on the substrate 21, and the first silicon nitride protective film 23 is deposited on the first metal layer 22. The second metal layer 24 is deposited on the first silicon nitride protective film 23, and the second silicon nitride protective film 25 is deposited on the second metal layer 24. The conductive film 28 is deposited on the second metal layer 24 where the second silicon nitride protective film 25 is etched, and connected with the first metal layer 22 through the contact hole 26 which passes through the second silicon nitride protective film 25 and the first silicon nitride protective film 23, so that the first metal layer 22 is connected and conducted with the second metal layer 24. When each of the metal layers is finished, they must be protected by depositing a silicon nitride protective film, which is used to prevent the different metal layers from short-circuiting. In the location of the contact hole 26 of the present invention, the second silicon nitride protective film 25 and the first silicon nitride protective film 23 are etched by an etching method, so that the different metal layers are connected by the conductive film 28. It is possible to use just one patterning process to selectively etch the second silicon nitride protective film 25 and the first silicon nitride protective film 23 to form the contact hole 26, which exposes the first metal layer 22, and simultaneously etch the second silicon nitride protective film 25 to expose the second metal layer 24.

As mentioned above, the different metal layers are connected by etching a part of the silicon nitride protective films near the different metal layers which are need to be connected and conducted, and depositing the conductive film thereon. By only passing through the contact hole 26 on the first metal layer 22, and climbing the first silicon nitride protective film 23, the conductive film can connect together the two metal lines, so that the connecting distance of the conductive film between the different metal layers is decreased. Because a resistance is directly proportional to the length thereof, when the connecting distance of the conductive film between the different metal layers is decreased, the impedance value between metals is decreased therewith, so as to effectively lower the contact impedance between the different metal layers, increase the product yield rate, and increase the competitive capability of the product.

In the embodiment, the contact hole 26 passes through the second silicon nitride protective film 25 and the first silicon nitride protective film 23, and connects with the first metal layer 22 and the second metal layer 24, respectively. That is, by selectively etching the second silicon nitride protective film 25 and the first silicon nitride protective film 23 to form the contact hole 26, the conductive film 28 can connect with the first metal layer 22 and the second metal layer 24 by only the contact hole 26, so as to effectively lower the connecting distance of the conductive film between the different metal layers.

In the embodiment, the material of the conductive film 28 is an ITO (indium tin oxide), and by changing the wider metal lines into the ITO lines, and by connecting the two ends of the metal lines through a bridge connection method of a contact hole, a chance of injury from ESD (electro-static discharge) for the TFT device of a liquid crystal display can be lowered. In another embodiment, the material of the conductive film 28 can also be an AZO (aluminum-doped zinc oxide) or an IZO (indium-doped zinc oxide). In the embodiment, the first metal layer 22 is a scan electrode line, and the second metal layer 24 is a signal electrode line. By etching the second silicon nitride protective film 25 on the signal electrode line to expose the signal electrode line, etching the second silicon nitride protective film 25 and the first silicon nitride protective film 23 to expose the scan electrode line, and then depositing the ITO to connect with the signal electrode line and the scan electrode line, the connecting distance of the ITO between the signal electrode line and the scan electrode line is decreased. Because a resistance is directly proportional to the length thereof, when the connecting distance of the ITO is decreased, the impedance value between metals is decreased therewith, so as to effectively lower the contact impedance between the signal electrode line and the scan electrode line, increase the product yield rate, and increase the competitive capability of the product.

Figure 3:
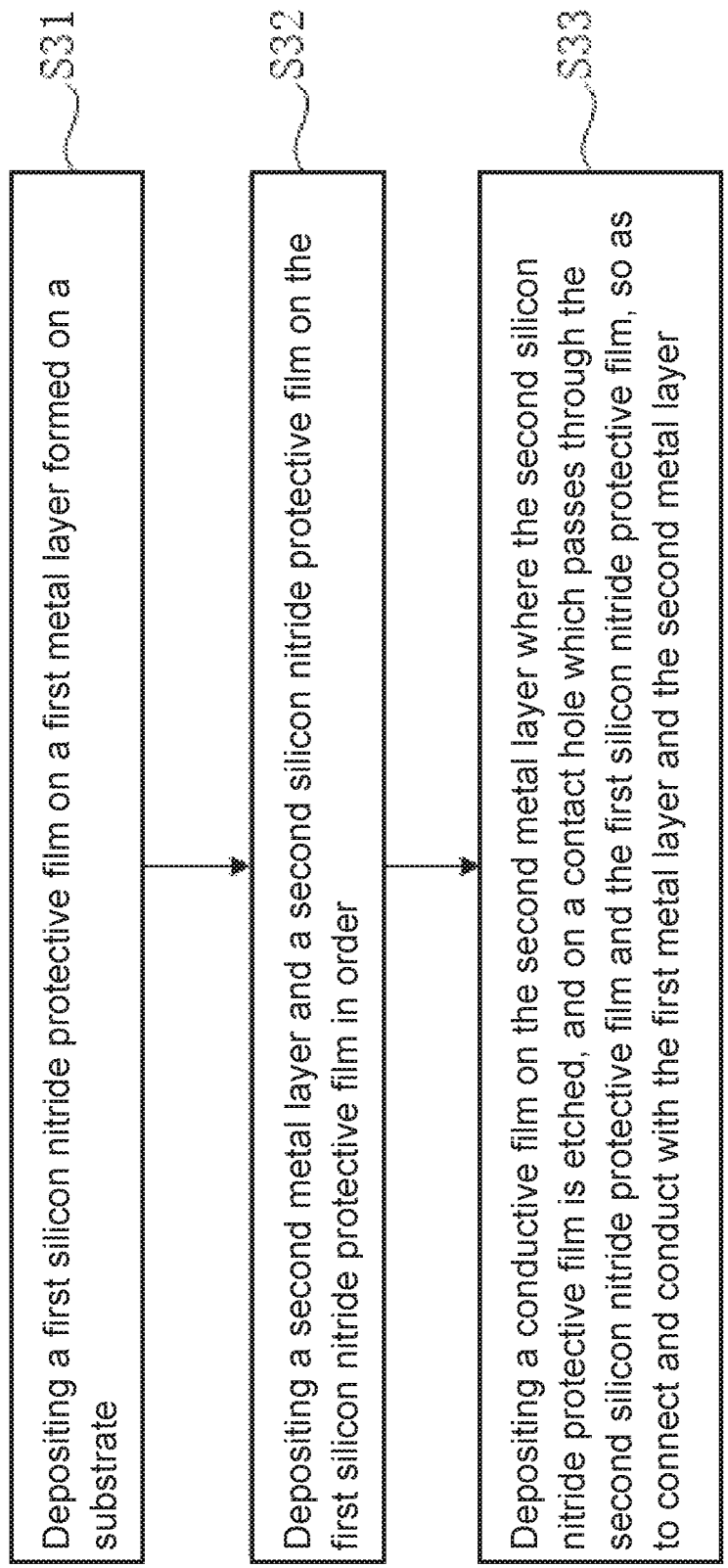
FIG. 3 is a schematic flow chart of a manufacturing method of the TFT device of a liquid crystal display of the present invention.

Refer now to FIG. 3, which is a schematic flow chart of a manufacturing method of the TFT device of a liquid crystal display of the present invention. As shown in FIG. 3, the manufacturing method of the TFT device of a liquid crystal display comprises: S31: depositing a first silicon nitride protective film on a first metal layer formed on a substrate; S32: depositing a second metal layer and a second silicon nitride protective film on the first silicon nitride protective film in order; and S33: depositing a conductive film on the second metal layer where the second silicon nitride protective film is etched, and on a contact hole which passes through the second silicon nitride protective film and the first silicon nitride protective film, so as to connect and conduct with the first metal layer and the second metal layer. It is possible to use just one patterning process to selectively etch the second silicon nitride protective film and the first silicon nitride protective film to form the contact hole, which exposes the first metal layer, and simultaneously etch the second silicon nitride protective film to expose the second metal layer. As mentioned above, the different metal layers are connected by etching a part of the silicon nitride protective films near the different metal layers which are need to be connected and conducted, and depositing the conductive film thereon, so that the connecting distance of the conductive film between the different metal layers is decreased. Because a resistance is directly proportional to the length thereof, when the connecting distance of the conductive film between the different metal layers is decreased, the impedance value between metals is decreased therewith, so as to effectively lower the contact impedance between the different metal layers, increase the product yield rate, and increase the competitive capability of the product.

In the embodiment, the contact hole passes through the second silicon nitride protective film and the first silicon nitride protective film, and connects with the first metal layer and the second metal layer, respectively. That is, by selectively etching the second silicon nitride protective film 25 and the first silicon nitride protective film to form the contact hole, the conductive film 28 can connect with the first metal layer and the second metal layer by only the contact hole, so as to effectively lower the connecting distance of the conductive film between the different metal layers.

In the embodiment, the material of the conductive film is an ITO; the first metal layer 22 is a scan electrode line; and the second metal layer 24 is a signal electrode line. By etching the second silicon nitride protective film on the signal electrode line to expose the signal electrode line, etching the second silicon nitride protective film and the first silicon nitride protective film to expose the scan electrode line, and then depositing the ITO to connect with the signal electrode line and the scan electrode line, the connecting distance of the ITO between the signal electrode line and the scan electrode line is decreased. Because a resistance is directly proportional to the length thereof, when the connecting distance of the ITO is decreased, the impedance value between metals is decreased therewith, so as to effectively lower the contact impedance between the signal electrode line and the scan electrode line, increase the product yield rate, and increase the competitive capability of the product.

The present invention has been described with preferred embodiments thereof and it is understood that many changes and modifications to the described embodiment can be carried out without departing from the scope and the spirit of the invention that is intended to be limited only by the appended claims.

What is claimed is:

1. A TFT device of a liquid crystal display, comprising:
   a substrate;
   a first metal layer formed on the substrate, wherein a first silicon nitride protective film is deposited on the first metal layer;
   a second metal layer deposited on the first silicon nitride protective film, wherein a second silicon nitride protective film is deposited on the second metal layer; and
   a conductive film, wherein one part of the conductive film is deposited on the second metal layer where the second silicon nitride protective film is etched, and is directly connected with the second metal layer, and another part of the conductive film is connected with the first metal layer through a contact hole which passes through the second silicon nitride protective film and the first silicon nitride protective film, so that the first metal layer is connected and conducted with the second metal layer;
   wherein the second silicon nitride protective film and the first silicon nitride protective film are etched by one patterning process to form the contact hole which exposes the first metal layer, while the second silicon nitride protective film is etched to expose the second metal layer; and the contact hole passes through the second silicon nitride protective film and the first silicon nitride protective film to contact with the first metal layer and the second metal layer, respectively.

2. The TFT device of the liquid crystal display according to claim 1, wherein the first metal layer is a scan electrode line, and the second metal layer is a signal electrode line.

3. The TFT device of the liquid crystal display according to claim 1, wherein the conductive film is made of indium tin oxide.

4. A TFT device of a liquid crystal display, comprising:
   a substrate;
   a first metal layer formed on the substrate, wherein a first silicon nitride protective film is deposited on the first metal layer;
   a second metal layer deposited on the first silicon nitride protective film, wherein a second silicon nitride protective film is deposited on the second metal layer; and
   a conductive film, wherein one part of the conductive film is deposited on the second metal layer where the second silicon nitride protective film is etched, and is directly connected with the second metal layer, and another part of the conductive film is connected with the first metal layer through a contact hole which passes through the second silicon nitride protective film and the first silicon nitride protective film, so that the first metal layer is connected and conducted with the second metal layer.

5. The TFT device of the liquid crystal display according to claim 4, wherein the contact hole passes through the second silicon nitride protective film and the first silicon nitride protective film to contact with the first metal layer and the second metal layer, respectively.

6. The TFT device of the liquid crystal display according to claim 4, wherein the second silicon nitride protective film and the first silicon nitride protective film are etched by one patterning process to form the contact hole which exposes the first metal layer, while the second silicon nitride protective film is etched to expose the second metal layer.

7. The TFT device of the liquid crystal display according to claim 4, wherein the first metal layer is a scan electrode line, and the second metal layer is a signal electrode line.

8. The TFT device of the liquid crystal display according to claim 4, wherein the conductive film is made of indium tin oxide.

9. A manufacturing method for a TFT device of a liquid crystal display according to claim 4, comprising:
   1) depositing a first silicon nitride protective film on a first metal layer formed on a substrate;
   2) depositing a second metal layer and a second silicon nitride protective film on the first silicon nitride protective film in order;
   3) electively etching the second silicon nitride protective film and the first silicon nitride protective film by one patterning process to form a contact hole which exposes the first metal layer, while the second silicon nitride protective film is etched to expose the second metal layer, wherein the contact hole passes through the second silicon nitride protective film and the first silicon nitride protective film to contact with the first metal layer and the second metal layer, respectively; and
   4) depositing a conductive film on the second metal layer where the second silicon nitride protective film is etched, and on the contact hole which passes through the second silicon nitride protective film and the first silicon nitride protective film, so as to connect and conduct with the first metal layer and the second metal layer, wherein the conductive film is directly connected with the second metal layer, and the conductive film is connected with the first metal layer through the contact hole.

10. The manufacturing method for the TFT device of the liquid crystal display according to claim 9, wherein the first metal layer is a scan electrode line; and the second metal layer is a signal electrode line.

11. The manufacturing method for the TFT device of the liquid crystal display according to claim 9, wherein the conductive film is made of indium tin oxide.

* * * * *